United States Patent [19]

Hanson et al.

[11] 4,012,724
[45] Mar. 15, 1977

[54] METHOD OF IMPROVING THE OPERATION OF A SINGLE WALL DOMAIN MEMORY SYSTEM

[75] Inventors: Marlin Marshall Hanson; Ernest James Torok; Roger Edward Lund, all of St. Paul, Minn.

[73] Assignee: Sperry Rand Corporation, New York, N.Y.

[22] Filed: Nov. 28, 1975

[21] Appl. No.: 636,178

[52] U.S. Cl. .................................... 340/174 TF
[51] Int. Cl.² ........................................ G11C 11/14
[58] Field of Search ............ 340/174 TF, 174 VA, 340/174 SB, 174 ZB, 174 BC, 174 PM

[56] References Cited

UNITED STATES PATENTS 3,840,865  10/1974  Holtzberg et al. ............... 340/147

*Primary Examiner*—Vincent P. Canney
*Attorney, Agent, or Firm*—Kenneth T. Grace; Thomas J. Nikolai; Marshall M. Truex

[57] ABSTRACT

A method of and an apparatus for improving the selective positioning of single wall domains or bubbles in a memory system is disclosed. The method includes the use of slotted intersecting digit and word lines that are coated with a magnetic material of relatively high retentivity.

4 Claims, 18 Drawing Figures

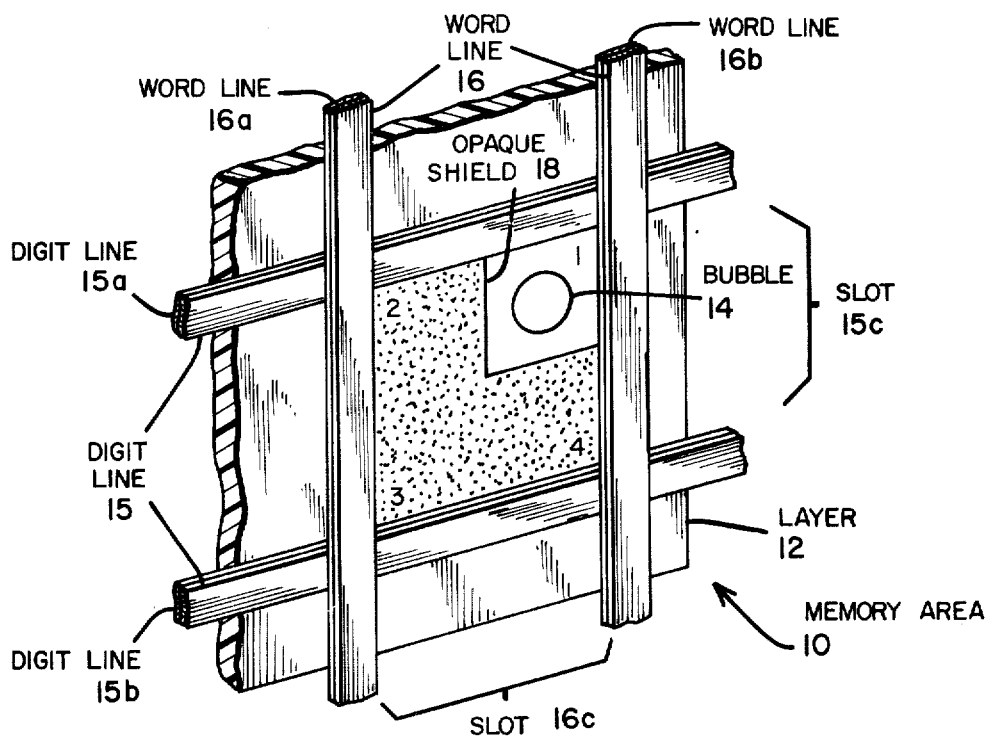
_Fig. 1_
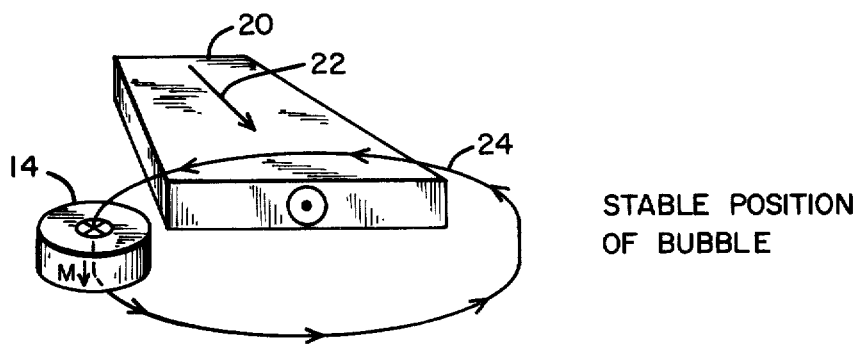
STABLE POSITION OF BUBBLE
_Fig. 2a_
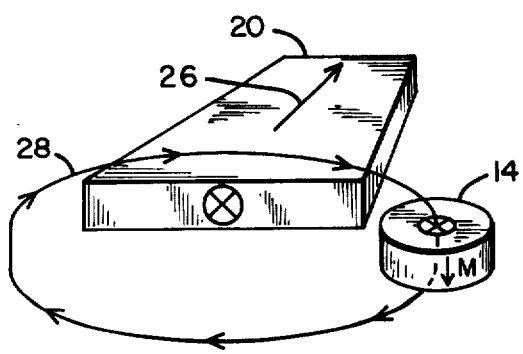
STABLE POSITION OF BUBBLE WHEN FIELD IS REVERSED
_Fig. 2b_

METHOD OF IMPROVING THE OPERATION OF A SINGLE WALL DOMAIN MEMORY SYSTEM

BACKGROUND OF THE INVENTION

In the copending patent application of E. J. Torok, et al, Ser. No. 603,840, having a filing date of Aug. 11, 1975, there is disclosed an optical page composer that is comprised of a magnetizable film layer in which single wall domains or bubbles may be sustained and moved about and to which are inductively coupled a digit line and a perpendicular word line, the intersection of which forms four quadrants that define or are defined by a memory area in the film layer. An opaque shield is oriented in the memory area for optically shielding a bubble except when in the first quadrant within the memory area. Coincident current selection, e.g., concurrent half-current selection, of the digit line and of the word line by half-select write signals of the proper polarities permits the one fully selected memory area to be fully selected for the selective writing of a 1 or of a 0 therein, e.g., the associated bubble is selectively positioned in either the first or the third quadrant.

The optical page composer is preferably comprised of a magnetizable film layer of, e.g., garnet, having orthogonal sets of parallel digit lines and parallel word lines, each intersection of which forms four quadrants that define or are defined by an associated memory area with an opaque shield oriented in three of the four quadrants of each memory area. Coincident current selection of a selected one of the digit lines and of a selected one of the word lines by half-select write signals of a first polarity for the writing of a 1 and of a second and opposite polarity for the writing of a 0 permits each separate one of the memory areas to be separately selected for the selective positioning of the associated bubble in either the first quadrant (write 1) or the third quadrant (write 0) of the associated memory area without substantially affecting the bubbles in the half-selected memory areas along the half-selected digit line and word line.

In the operation of such page composer, as during the writing or transferring operation, it has been observed that the bubbles, under certain operating conditions, may escape from their proper stable positions, e.g., the first quadrant, within the memory area, or, alternatively, may become "stuck" in one stable position and may not be selectively positioned from one stable position, e.g., the first quadrant, into another stable position, e.g., the third quadrant. The present invention is directed toward a method of ensuring the reliable operation of the page composer of such E. J. Torok, et al, patent application, including a modification of the stripline structure thereof.

BRIEF DESCRIPTION OF THE DRAWINGS

FIG. 1 is a perspective view of one memory area of the page composer of the present invention.

FIG. 2a and 2b are illustrations of the stable positions of a bubble about a stripline when affected by a magnetic field generated by a current flowing therethrough.

DESCRIPTION OF THE PREFERRED EMBODIMENTS

Figure 3:
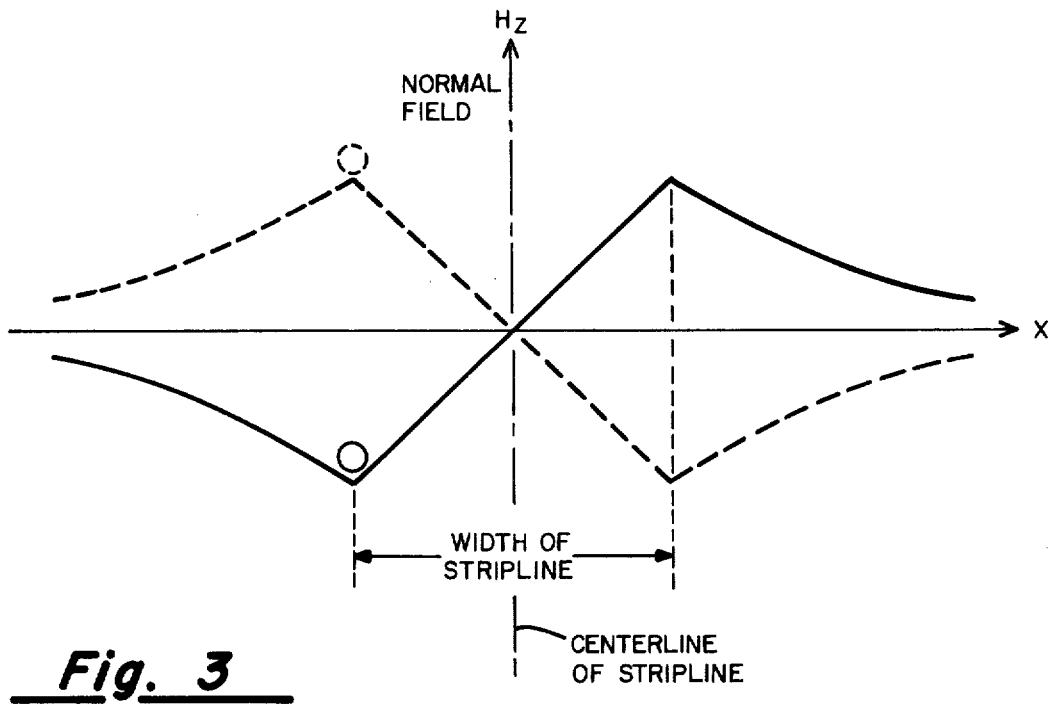
FIG. 3 is a graph of the field component $H_z$ that is normal to the film layer of FIG. 1 that is achieved by a stripline that is substantially in contact with the film layer.

With particular reference to FIG. 1 there is presented a perspective view of one memory area 10 of a page composer that may be similar to that of the hereinabove referenced E. J. Torok, et al, patent application into which page composer the present invention is incorporated. Layer 12 is a planar film layer of magnetizable material, e.g., garnet, in which single wall domains or bubbles 14 may be sustained and moved about. Superposed layer 12 and parallel to the plane thereof are digit line 15, comprised of the two parallel digit lines 15a, 15b forming the slot 15c therebetween, and word line 16, comprised of the two parallel word lines 16a, 16b forming the slot 16c therebetween. Digit line 15 and word line 16 are oriented perpendicular to each other for forming the memory area 10 having the four quadrants 1, 2, 3, 4 that are defined by the intersecting slot 15c and slot 16c of digit line 15 and word line 16, respectively. Oriented within the memory area 10, defined by the intersecting slot 15c and slot 16c, is an opaque shield 18 that is oriented in the second, third and fourth quadrants but not in the first quadrant of the memory area 10, all as illustrated and discussed in more detail in the hereinabove referenced E. J. Torok, et al, patent application.

With particular reference to FIGS. 2a and 2b the theory of operation of the memory area 10 of FIG. 1 will now be explained. This operation is based upon the principle that a bubble 14 can be moved by the gradient of a magnetic field $H_z$ that is normal to the planar surface of magnetizable film layer 12, while bubble 14 moves toward that point in magnetizable film layer 12 where the normal field $H_z$ is of the greatest intensity and is in the direction of the magnetization M within bubble 14. FIG. 2a illustrates the condition when a current signal is coupled to a stripline 20 so as to flow in the direction denoted by vector 22 generating the associated counterclockwise magnetic field denoted by vector 24. As the field normal to magnetizable film layer 12 is of the greatest intensity just outside the edge of stripline 20, bubble 14 will nestle immediately adjacent to stripline 20. Conversely, when the current flowing in stripline 20 is reversed, as illustrated by vector 26 in FIG. 2b, the stable position of bubble 14 is on the opposite side of stripline 20. Thus, bubble 14 can be shifted forth and back between the two stable positions along the opposing edges of stripline 20 by reversing the direction of current flow in stripline 20. Since there is a coercivity associated with the bubble 14, as with all magnetic domains, bubble 14 remains in either of these two stable positions after termination of the current flow in stripline 20. As discussed hereinabove, the present invention is directed toward a method of improving the operation of the E. J. Torok, et al, patent application wherein the above discussed problems of bubble "escaping" and bubble "sticking" have been observed.

Bubble Escaping

When bubble 14 is being transferred forth and back from one side of stripline 20 to the other side, as illustrated and discussed with particular reference to FIGS. 2a and 2b, bubble 14 is sometimes observed to escape from the above discussed stable positions. As discussed with particular reference to FIGS. 2a and 2b, the reversal of the direction of the current flow in stripline 20, as from the direction denoted by vector 22 in FIG. 2a to the direction denoted by vector 26 in FIG. 2b, bubble 14 should be expected to be moved from the stable position of FIG. 2a into the stable position of FIG. 2b passing from one edge of stripline 20 to the other edge thereof. However, observation of the operation of memory area 10 using the Faraday magneto-optic effect has indicated that bubble 14 may, under certain conditions, be repelled away from stripline 20 such as being moved further to the left from stripline 20 as illustrated in FIG. 2a rather than being moved to the right as illustrated in FIG. 2b.

The reason that this "escaping" of bubble 14 may occur can be explained with particular reference to FIG. 3 wherein there is illustrated a diagramatic illustration of the field component $H_z$ normal to the film layer 12 of FIG. 1 achieved by stripline 20 when substantially in contact with film layer 12. FIG. 3 illustrates the normal field component, $H_z$, from stripline 20 as a function of the distance X from the center of stripline 20 along the surface of film layer 12. It is this normal field $H_z$ that is responsible for moving bubble 14 with respect to stripline 20 wherein the magnetomotive force on bubble 14 is proportional to the slope of the normal field $H_z$. The mechanical analogy is that of a ball rolling down hill; the potential energy of bubble 14 is proportional to the heights of the "hill" of the normal field $H_z$ as illustrated in FIG. 3. When the current in stripline 20 is reversed, as illustrated in FIGS. 2a and 2b, the valleys become peaks and correlatively the peaks become valleys wherein bubble 14 is supposed to "roll down hill" to the other side of stripline 20. However, as illustrated in FIG. 3, there is the other possibility that bubble 14 can "roll" down the other side of the "hill," i.e., move to the left of FIG. 3, and be repelled from stripline 20. Bubble 14, as depicted by the dashed circle in FIG. 3, is in this position of unstable equilibrium wherein bubble 14 may "roll" down either side of the "hill," to move to the right to the other side of stripline 20 or, alternatively, to move to the left to be repelled from stripline 20.

Bubble Sticking

The second problem observed in the operation of the memory area of FIG. 1 is that bubble 14 may become "stuck" in one of its stable positions, as illustrated in FIGS. 2a and 2b, and will not return to the other side of stripline 20 when subjected to a normal drive field unless multiple pulses or a single pulse of a larger amplitude is utilized. This problem can be understood by introducing the concept of the coercive field $H_C$ as follows.

The coercive field $H_C$ of a domain wall is that field that is necessary to move the domain wall across various film imperfections and inhomogeneities. The average field tending to move bubble 14 is the difference between the two fields on opposite sides of bubble 14; if the average width of bubble 14 is represented by W, then this difference is approximately $$H_a = \frac{dH_z}{dx} W. \qquad (1)$$

Figure 4:
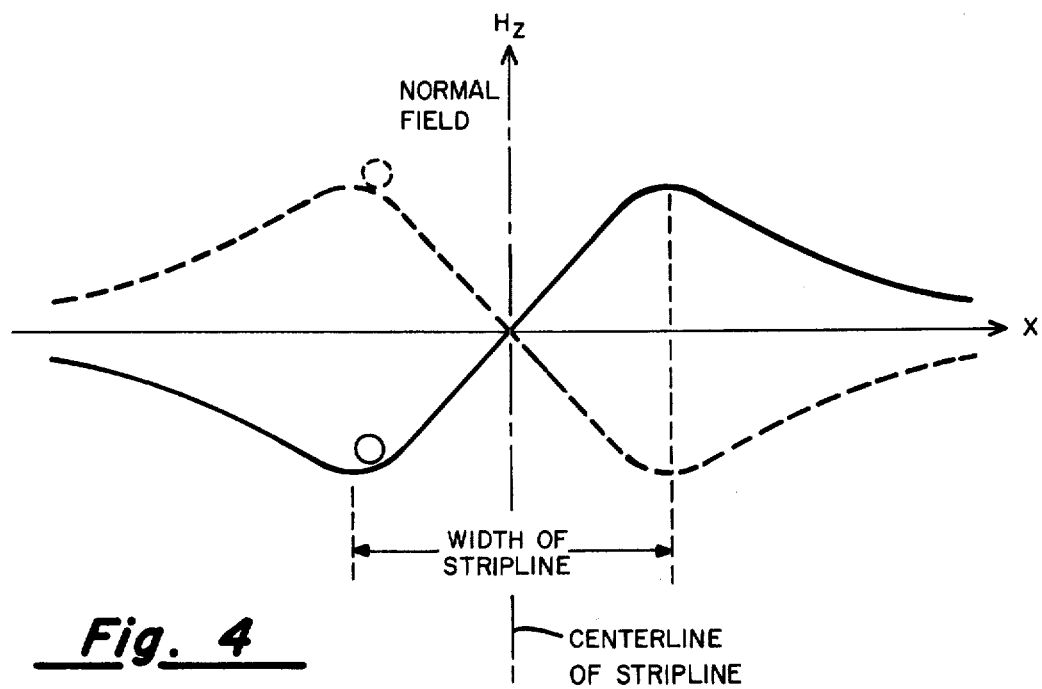
FIG. 4 is a graph of the field component $H_z$ that is normal to the film layer of FIG. 1 that is achieved by a stripline that is spaced a predetermined distance S above the film layer.

If this quantity is larger than the coercive force $H_C$, bubble 14 moves; otherwise, the bubble will not move and will become "stuck." Now, consider the case depicted in FIG. 4 wherein there is illustrated a diagramatic illustration of the field component $H_z$ normal to film layer 12 of FIG. 1 that is achieved by a stripline 20 that is spaced a distance S above the film layer 12. This slight separation of the stripline 20 above the surface of film layer 12 smoothes out the peaks and the valleys in the normal field $H_z$ graph as illustrated in FIG. 3. Under the conditions defined by FIG. 4, when bubble 14 has been moved or propagated under stripline 20, such as illustrated in FIGS. 2a, 2b, the bubble 14 will come to rest at a stable position at the point $X_0$ where $$\frac{dH_z}{dx}(X_0) W - H_C = 0. \qquad (2)$$

Now, when the polarity of the current in stripline 20 is reversed, the normal field $H_z$ then tends to push bubble 14 in the opposite direction; however, the normal field $H_z$ is opposed by the coercive field $H_C$ such that the net force on bubble 14 is $$\frac{dH_z}{dx}(X_0) W - H_C = 0.$$

Therefore, under these stated conditions bubble 14 does not move from its stable position. Now, if the current flowing in stripline 20 is increased in amplitude only an infinitesimal amount, bubble 14 will move to the opposite side of stripline 20; however, each time bubble 14 is moved or propagated from one edge of stripline 20 to the other edge, the current required to move it again increases in amplitude. This increase in the amplitude of the current flowing in stripline 20 that is required to move or propagate bubble 14 from one edge of stripline 20 to the other edge on each successive transfer operation is, of course, unsatisfactory for normal operation as a memory device.

Solution

The solution to the above described two problems of bubble escaping and bubble sticking, as proposed by the present invention, includes two essential coacting elements: a slotted stripline; and, layers of a magnetic material of relatively high retentivity, e.g., cobalt, adjacent to the two portions of the slotted stripline. The cobalt layers on opposite sides of the memory area tend to orient the bubble away from underneath the stripline and within the memory area that is defined by the slot for performing the same function, but in a more efficient manner, as the stripline-magnetic film layer separation discussed above.

Figure 5:
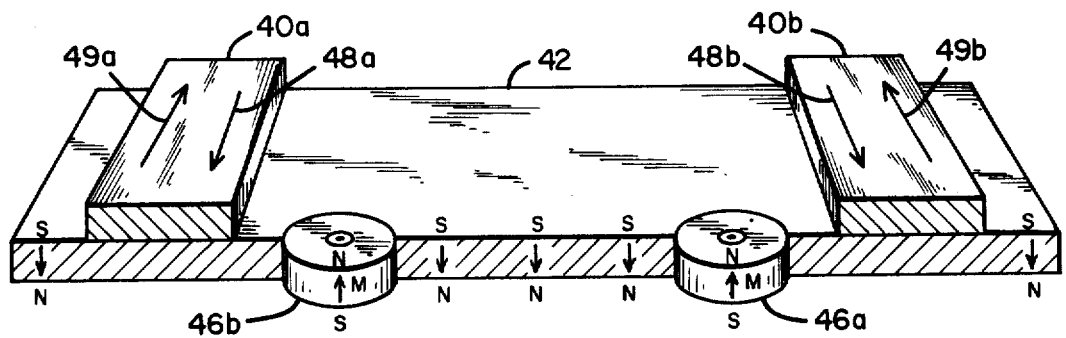
FIG. 5 is a perpsective view of a cross section of a split stripline and the associated stable positions of the bubble when affected by current signals of opposite polarities flowing therethrough.
Figure 6:
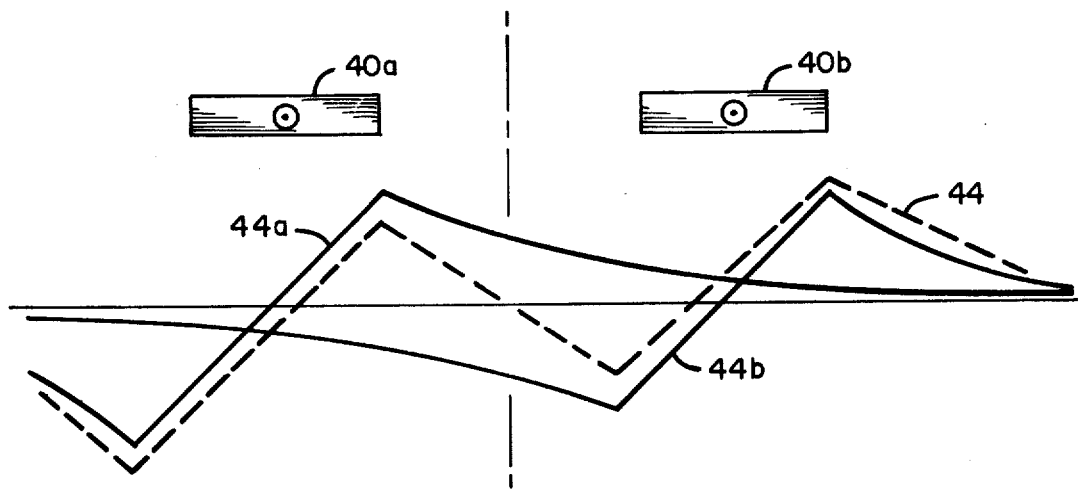
FIG. 6 is a graph of the field component $H_z$ that is normal to the film layer and associated with FIG. 5.

Consider a stripline 40 with a long slot etched in the center thereof for forming the two striplines 40a, 40b, such as illustrated in FIG. 5. With striplines 40a, 40b deposited directly upon garnet film layer 42, the normal field component $H_Z$ generated by a drive current signal I flowing, in the same direction, in striplines 40a, 40b, is plotted in FIG. 6 with the component provided by the current flowing in stripline 40a identified by the reference letter 44a, the component provided by the current flowing in stripline 40b identified by the reference numeral 44b and the sum of both components plotted as the dashed line and identified by the reference 44. With the current flowing in striplines 40a, 40b, as identified by the respective vectors 48a, 48b of FIG. 5, bubble 46 within the slot between striplines 40a and 40b is positioned along the inside edge of stripline 40a and is identified as bubble 46a, while with the current flowing in striplines 40a, 40b in the opposite direction, as identified by vectors 49a, 49b, bubble 46 within the slot between striplines 40a and 40b is positioned along the inside edge of stripline 40b and is identified as bubble 46b. When two slotted striplines intersect, as in FIG. 1, forming a memory area 10 as defined by the area of film layer 12 that is common to the two intersecting slots, the bubble initially established therein may be transferred from any one of the four corners of the memory area, identified as quadrant one, two, three, four, to any other one of the four corners by the judicious use of half-select and full-select drive current signals in a manner similar to that discussed in the hereinabove referenced E. J. Torok, et al, patent application.

Figure 7:
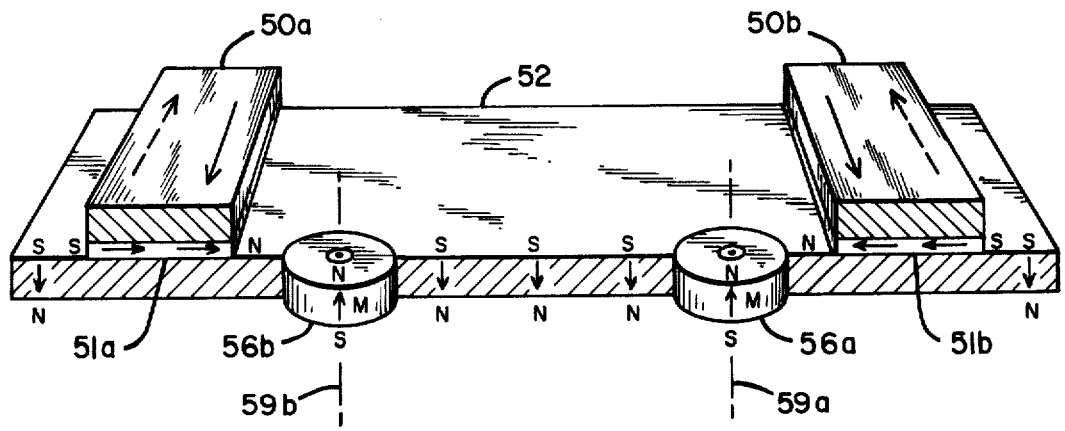
FIG. 7 is a perspective view of a cross section of a split stripline having layers of magnetic material of relatively high retentivity associated therewith and the associated stable positions of the bubble when affected by current signals of opposite polarities flowing therethrough.

In order to discuss bubble sticking, consider the single slotted stripline 50 of FIG. 7 comprised of striplines 50a, 50b which directly sandwich associated hard magnetic layers 51a, 51b, i.e., layers of relatively high magnetic retentivity, between the associated striplines 50a, 50b and the garnet film layer 52. When the hard magnetic layer of relatively high magnetic retentivity, e.g., cobalt, is added to the configuration of FIG. 5, with the residual magnetism of cobalt layers 51a and 51b permanently established in the inwardly directed orientations as illustrated in FIG. 7, the cobalt layers 51a, 51b add a repelling magnetic field whose effect upon the associated bubbles 56a, 56b is to repel such bubbles 56a, 56b from their original stable positions along the inside edges, such as illustrated in FIG. 5, but in a spaced relationship away from the associated striplines 50a, 50b toward the longitudinal centerline of the associated slot formed by striplines 50a, 50b. Accordingly, the cobalt layers 51a, 51b function as a magnetostatic barrier to the associated bubbles 56a, 56b, preventing such bubbles from moving out of the memory area 10 defined by the slot between the two striplines 50a, 50b. The magnetization direction of the cobalt layers 51a 51b is established, as shown in FIG. 7, at the time of the manufacture thereof, and is never subsequently substantially affected by the working fields associated with the bubble memory.

Figure 8:
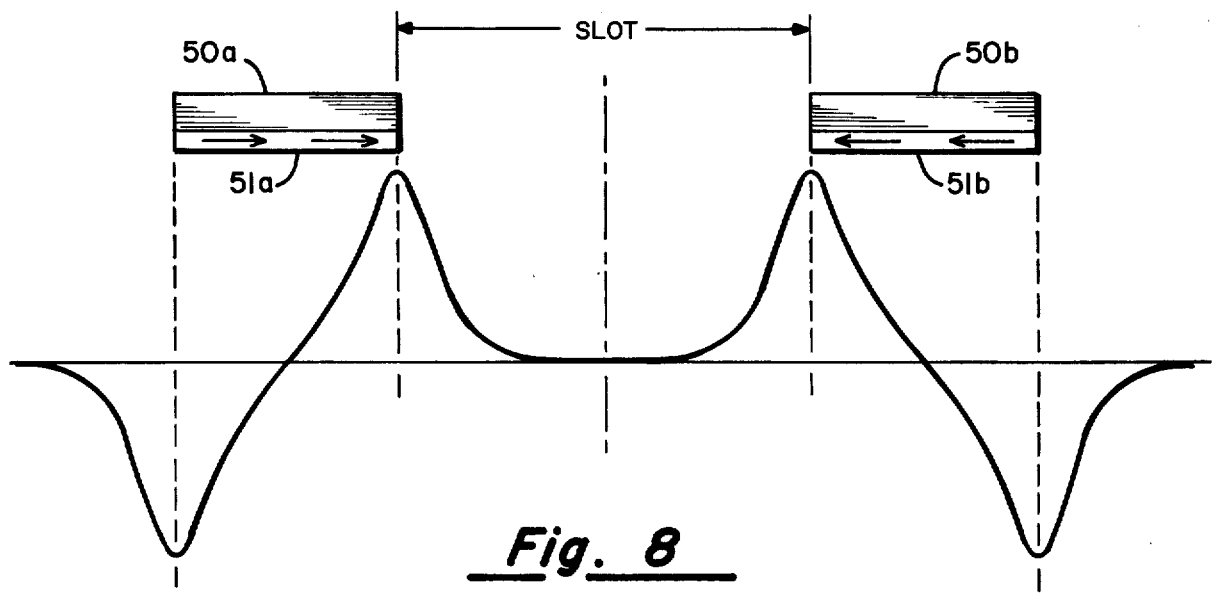
FIG. 8 is a graph of the field component $H_z$ that is normal to the film layer and that is due to the residual magnetic fields of the layers of magnetic materials of relatively high retentivity.
Figure 9:
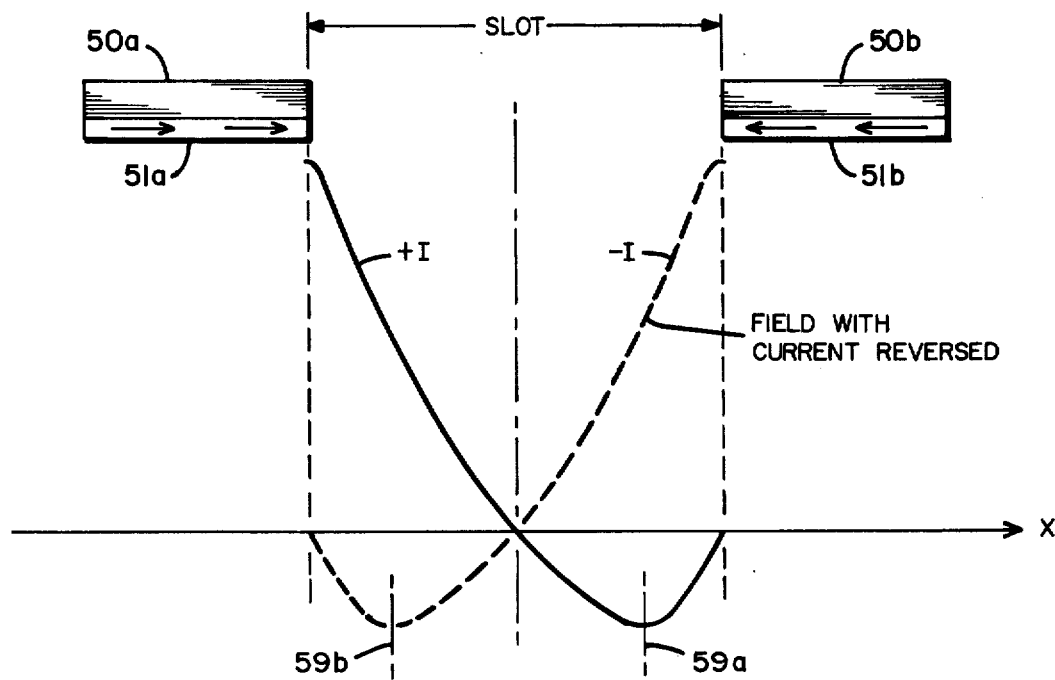
FIG. 9 is a graph of the field component $H_z$ that is normal to the film layer and that is due to both the residual magnetism of the layers of magnetic material of relatively high retentivity and current signals of opposite polarities flowing through the split stripline.

With particular reference to FIG. 8 there is illustrated a plot of the normal component of field $H_Z$ generated by a 30.0 micron ($\mu$m) wide cobalt film 51a, 51b upon a 6.0 $\mu$m wide pair of striplines 50a, 50b with an 18.0 $\mu$m wide slot, all formed upon a garnet layer 52 that is 2.0 $\mu$m thick, with the cobalt layers 51a, 51b deposited directly upon garnet layer 52 and the striplines 50a, 50b deposited directly upon the cobalt layers 51a, 51b. While the normal component of field $H_Z$ from the cobalt layers 51a, 51b alone is plotted in FIG. 8, FIG. 9 is, in contrast, a plot of the normal component of field $H_Z$ due to the combined effect of the residual magnetism of the cobalt layers 51a, 51b and the electromagnetic effect of the current I flowing in the striplines — the flow of the positive current +I is illustrated by the solid curve, while, in contrast, the flow of the negative current −I is illustrated by the dashed line curve. Note in FIG. 9 that the normal component of field $H_Z$ is not at a minimum value at the slot edge, as in FIG. 8, but, because of the effect of the cobalt layers, has been moved inwardly from the inside edges of the striplines to the positions 59a, 59b. These points of minimum intensity of the normal component of the field $H_Z$ mean that the associated bubble will now reside at the points 59a, 59b, as illustrated in FIG. 7, rather than along the inside edges of the striplines as illustrated in FIG. 5. FIG. 9 also indicates that when the current I, flowing in the striplines 50a, 50b, is reversed in direction, as from +I to −I, the normal component of the field $H_Z$ at the position of the former minimum value is not now a maximum value but has a strong slope or a relatively large change of field intensity with change of position within the slot. This strong slope or gradient in the intensity of the normal component of the field $H_Z$ within the slot prevents the bubble within the slot from either sticking or escaping.

The quantitative analysis of this operation is as follows: let the normal component of field $H_Z$ from the cobalt layer be $H_{B(X)}$ and let $X_O$ be the place where the bubble comes to rest within the slot. At that point, in an analogy with equation (2) above, $$\frac{dH_Z}{dx}(X_o)W + \frac{dH_B}{dx}(X_o)W - H_c = 0. \qquad (3)$$

As an example, the first term of equation (4) may be 1.0 oersteds (oe), the second term −0.5 oe and the third term, $H_C$, may be 0.5 oe. When the current in the stripline is reversed, the net forcing field upon the bubble, including the coercive field, is $$\frac{-dH_Z}{dx}(X_o)W + \frac{dH_B}{dx}(X_o)W + H_C = 0 \qquad (4)$$

and when the values from the above examples are substituted, we find $$-1 \text{ oe} + 0.5 \text{ oe} + 0.5 \text{ oe} = -1 \text{ oe}; \qquad (5)$$

therefore, the bubble will move. This is in contrast to the situation described above with respect to equation (3), where the sum was zero and the bubble was stuck in its original stable position. Accordingly, in the present invention, the slotted or split drive line and the hard magnetic layer (1) create an electromagnetic barrier that prevents the bubble from escaping from the memory area that is defined by the slot which is formed by the inside edges of the two drive lines of the split drive line, (2) move the bubble away from the inside edge of the associated one drive line of the split drive line so as not to be optically hidden by the so-associated one split drive line, and, (3) prevent the bubble from sticking in its so-established stable state but create a strong slope or change of electromagnetic field intensity versus distance within the slot established by the two drive lines which strong slope prevents the bubble from sticking in its one established stable position.

Figure 10:
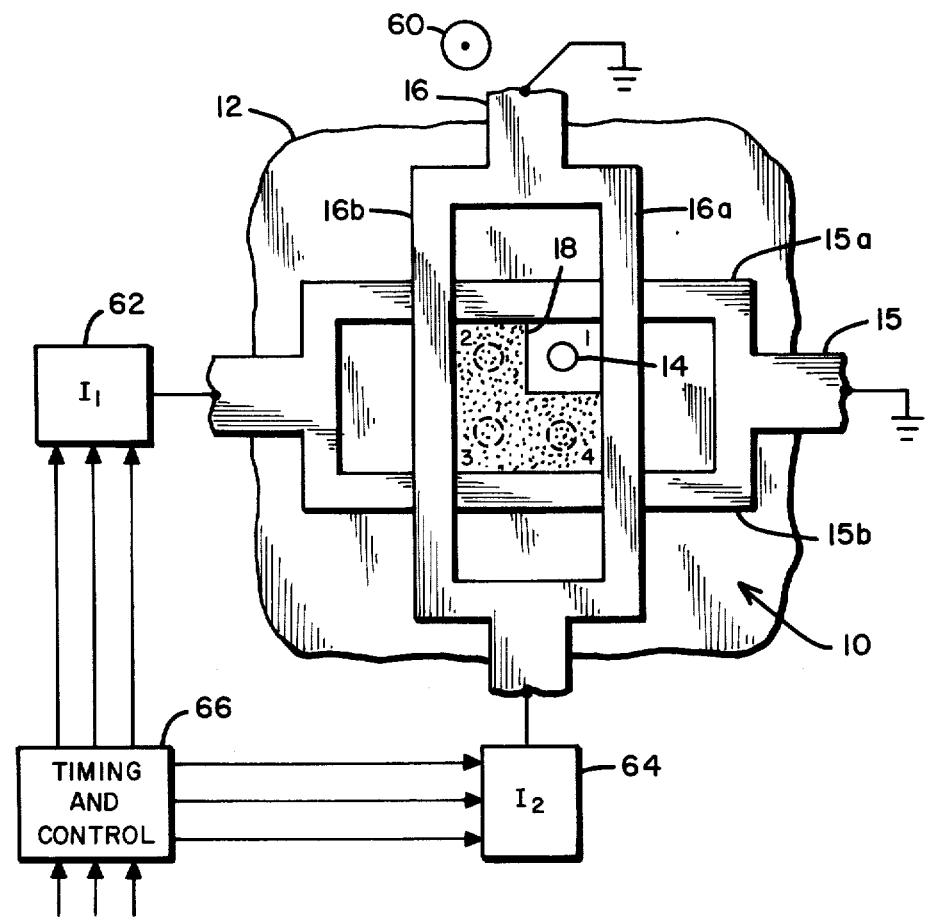
FIG. 10 is a schematic diagram of a bubble memory system for positioning a bubble within the memory area in any one of the four quadrants or corners thereof.
Figure 11A:
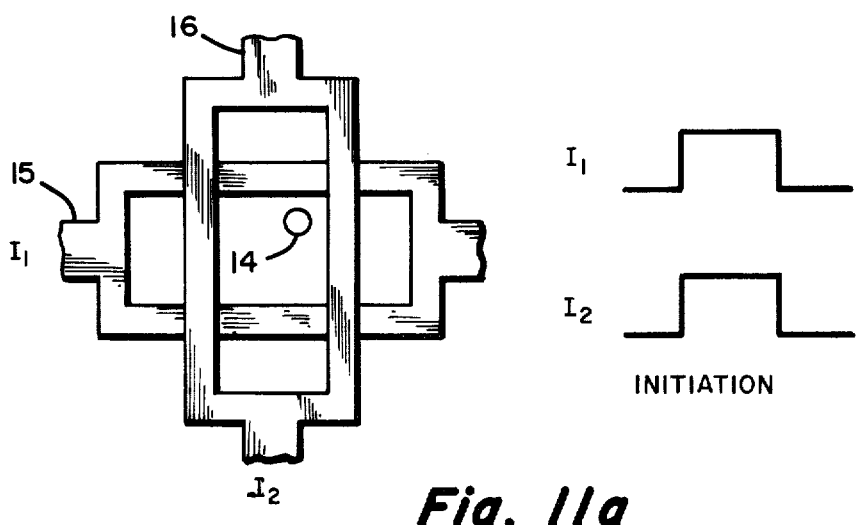
FIGS. 11a–11g are illustrations of current signal waveforms that may be utilized by the bubble memory system of FIG. 10.
Figure 11B:
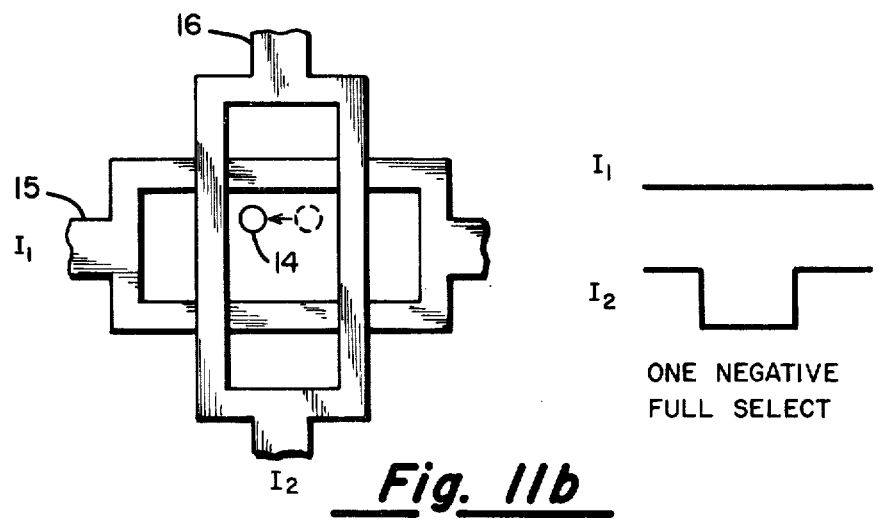
Figure 11C:
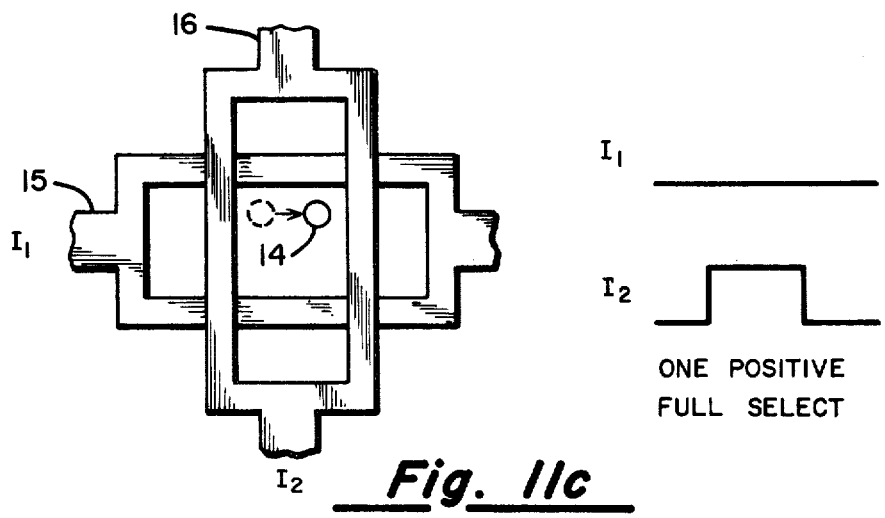
Figure 11D:
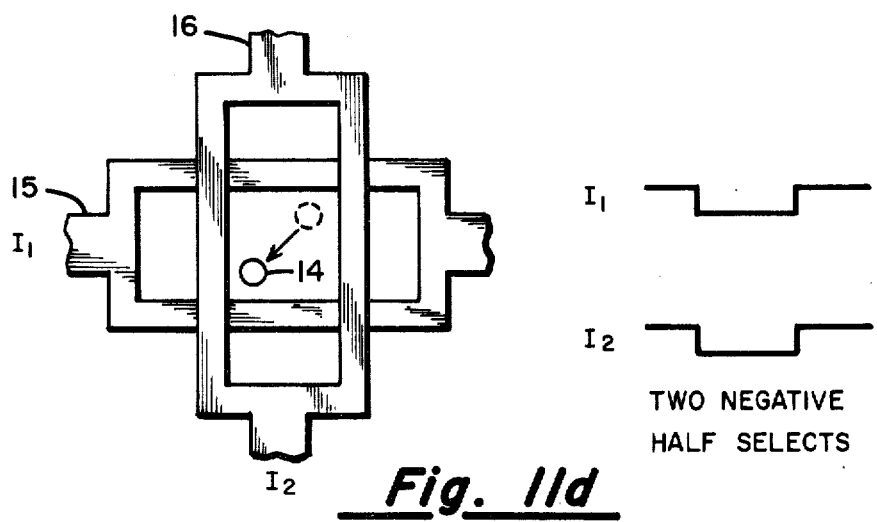
Figure 11E:
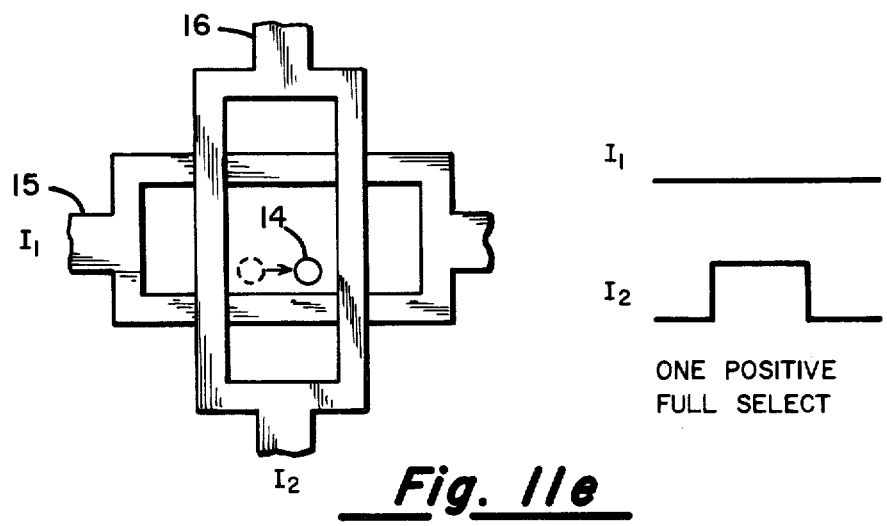
Figure 11F:
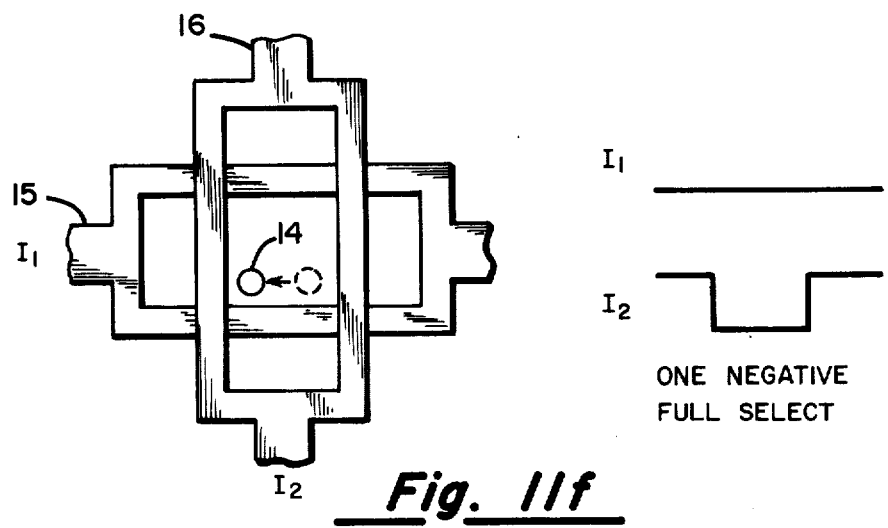
Figure 11G:
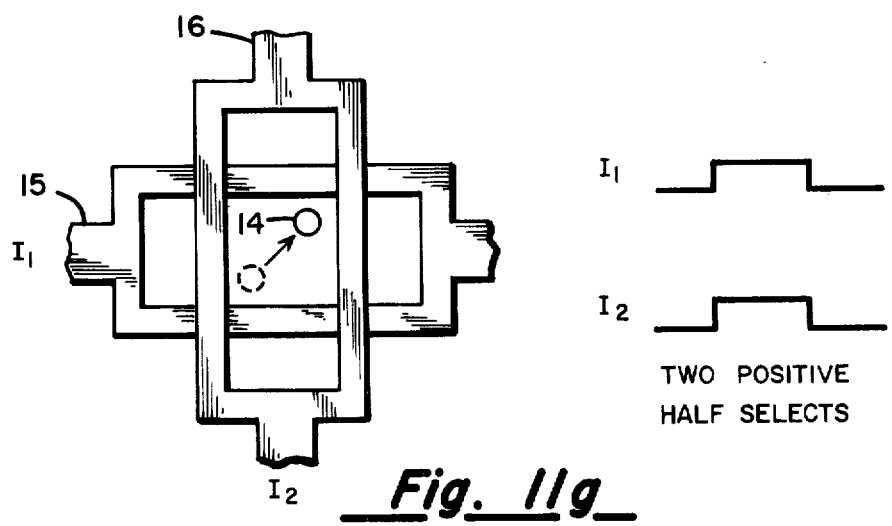

With particular reference to FIG. 10 there is presented a schematic illustration of the memory area of FIG. 1 including the necessary word and digit drivers, while in FIG. 11 there is presented an illustration of the timing and waveform relationships that are associated with the operation of the memory area of FIG. 10. Provided is a bias field $H_B$ as represented by the circle 60, which implies a field directed upwardly normal to the plane of the layer 12 of magnetizable material, e.g., garnet, in which single wall domains or bubbles 14 may be sustained and moved about — such bias field $H_B$ may be provided by a configuration of Helmholtz coils such as illustrated in the A. H. Bobeck U.S. Pat. No. 3,534,347.

Using digit driver 62 as a source for the drive current signal $I_1$ and word driver 64 as a source for the word current signal $I_2$, all under control of timing and control 66, bubble 14 may be transferred from any one corner of the memory area 10, as denoted by quadrants 1, 2, 3, 4, to any other quadrant within memory area 10 as defined by the intersecting slots 15c, 16c of the intersecting digit stripline 15 and word stripline 15 and word stripline 16 when energized by the judicious use of half-select and full-select drive current signals, all as illustrated in FIGS. 11a through 11g.

What is claimed is:

1. In a bubble memory system including a planar layer of a magnetizable material in which single wall domains or bubbles may be sustained and moved between first, second, third and fourth stable positions in a memory area in said layer, which stable positions are associated with intersecting first and second inductively coupled striplines, by drive current signals that are coupled to said layer by said striplines, the method of preventing said bubbles from escaping from the magnetomotive effect of said drive current signals to transfer said bubbles between said first, second, third and fourth stable positions or from sticking in either said first, second, third or fourth stable positions, comprising:
    forming a slot in each of said first and second intersecting striplines in the area of said intersection for forming a memory area that is defined by said intersecting slots;
    forming magnetic layers of a relatively high retentivity upon each of said first and second striplines in said memory area;
    establishing the magnetization in the magnetic layers of a relatively high retentivity which are formed upon each of said first and second striplines, in opposing directions oriented across their respective slots for magnetically repelling said bubble away from said first and second striplines and into said memory area.

2. In a bubble memory system including a planar layer of a magnetizable material in which single wall domains or bubbles may be sustained and moved between first and second stable positions in a memory area in said layer, which stable positions are associated with an inductively coupled stripline, by a drive current signal that is coupled to said layer by said stripline, the method of preventing said bubbles from escaping from the magnetomotive effect of said drive current signal to transfer said bubbles between said first and second stable positions or from sticking in either said first or second stable position, comprising:
    forming a slot in said stripline in said memory area;
    forming a magnetic layer of a relatively high retentivity upon said stripline in said memory area; and,
    establishing the magnetization in said magnetic layer of a relatively high retentivity in opposing directions for magnetically repelling said bubble away from said stripline and into said slot in said memory area.

3. In a bubble memory system including a planar layer of a magnetizable material in which single wall domains or bubbles may be sustained and moved between first, second, third and fourth stable positions in a memory area in said layer, which stable positions are associated with intersecting first and second inductively coupled striplines, by drive current signals that are coupled to said layer by said striplines, a stripline configuration that prevents said bubbles from escaping from the magnetomotive effect of said drive current signals to transfer said bubbles between said first, second, third and fourth stable positions and that prevents said bubbles from sticking in either said first, second, third or fourth stable position, comprising:
    first and second intersecting striplines, each having a slot in the area of said intersection for forming a memory area that is defined by the area in said magnetizable material that is common to said intersecting slots;
    first and second magnetic layers of relatively high retentivity adjacent to said first and second striplines, respectively, in said memory area;
    the magnetization in said first and second magnetic layers of relatively high retentivity in the area of the associated slots established in opposing directions oriented across their respective slots for magnetically repelling said bubble away from said first and second striplines and into said memory area that is defined by the area in said magnetizable material that is common to said intersecting slots.

4. In a bubble memory system including a planar layer of a magnetizable material in which single wall domains or bubbles may be sustained and moved between first and second stable positions in a memory area in said layer, which stable positions are associated with an inductively coupled stripline, by a drive current signal that is coupled to said layer by said stripline, a stripline configuration that prevents said bubbles from escaping from the magnetomotive effect of said drive current signal to transfer said bubbles between said first and said second stable positions and that prevents said bubbles from sticking in either said first or said second stable position, comprising:
    a stripline having a slot that defines a memory area;
    a magnetic layer of a relatively high retentivity adjacent to said stripline in the area of said slot; and,
    the magnetization in said magnetic layer of a relatively high retentivity in the area of said slot established in opposing directions across said slot for magnetically repelling said bubble away from said stripline and into said slot in said memory area.

* * * * *